US012615051B1

(12) United States Patent　　(10) Patent No.: US 12,615,051 B1
Namboodiri et al.　　　　　　　(45) Date of Patent: Apr. 28, 2026

(54) CALIBRATION FOR SAMPLING METHODS AND SYSTEMS

(71) Applicant: Alphacore, Inc., Tempe, AZ (US)

(72) Inventors: Sachin Namboodiri, Tempe, AZ (US);
Phaneendra Bikkina, Tempe, AZ (US)

(73) Assignee: Alphacore, Inc., Tempe, AZ (US)

( * ) Notice: Subject to any disclaimer, the term of this
patent is extended or adjusted under 35
U.S.C. 154(b) by 0 days.

(21) Appl. No.: 19/272,659

(22) Filed: Jul. 17, 2025

(51) Int. Cl.
　　*H03M 1/00*　　　(2006.01)
　　*H03K 17/56*　　(2006.01)
(52) U.S. Cl.
　　CPC ............ *H03M 1/002* (2013.01); *H03K 17/56*
　　　　　　　　　　　　　　　　　　　(2013.01)
(58) Field of Classification Search
　　CPC ...... H03M 1/002; H03M 1/001; H03M 1/004;
　　　　　　H03M 1/005; H03M 1/008; H03M 1/06;
　　　　　　H03M 1/0602; H03M 1/0604; H03M
　　　　　　1/0607; H03M 1/0612; H03M 1/121;

H03M 1/124; H03M 1/1245; H03M
1/1255; H03M 1/1285; H03K 17/56;
G11C 27/02; G11C 27/024
See application file for complete search history.

(56) References Cited

U.S. PATENT DOCUMENTS 8,487,795 B1 * 7/2013 Jiang ................... G11C 27/024
　　　　　　　　　　　　　　　　　　　　　327/434

* cited by examiner

*Primary Examiner* — Jung Kim
(74) *Attorney, Agent, or Firm* — LOZA & LOZA, LLP

(57) ABSTRACT

A calibration unit for a sampling system, a sampling system
and a method for sampling. The calibration unit for a
sampling system includes an oscillator having a number of
cycles, a digital counter configured to capture a count value
that is representative of a time duration to complete the
number of cycles, a digital integrator configured to accu-
mulate a difference between a predetermined count value
and the captured count value, and a digital to analog
converter (DAC) configured to translate an output from the
digital integrator to an analog input for delay cells in the
sampling system.

20 Claims, 13 Drawing Sheets

1302

GENERATE SAMPLING CLOCK PULSES WITH RESPECTIVE PHASE OFFSETS

1304

CALIBRATE SAMPLING CELLS DISTRIBUTED IN SAMPLING CHANNELS TO CORRECT TIMING MISMATCHES IN THE SAMPLING CHANNELS

1306

DRIVE THE SAMPLING CELLS DISTRIBUTED IN THE SAMPLING CHANNELS USING THE SAMPLING CLOCK PULSES TO CAPTURE AND STORE ANALOG VALUES AT DISCRETE TIME INTERVALS

CALIBRATION FOR SAMPLING METHODS AND SYSTEMS

BACKGROUND

With advancements in technology, there is an increasing demand for systems capable of capturing high-speed signals with minimal power consumption and cost. Conventional high-speed analog-to-digital converters (ADCs) are often constrained by power requirements, complexity, and physical area. Therefore, there is a need for sampling technology that can provide reliable and power efficient high-speed signal acquisition.

SUMMARY

Embodiments of a calibration unit for a sampling system, a sampling system and a method for sampling are disclosed. In an embodiment, a calibration unit for a sampling system includes an oscillator having a number of cycles, a digital counter configured to capture a count value that is representative of a time duration to complete the number of cycles, a digital integrator configured to accumulate a difference between a predetermined count value and the captured count value, and a digital to analog converter (DAC) configured to translate an output from the digital integrator to an analog input for delay cells in the sampling system. Other embodiments are also described.

In an embodiment, the DAC is further configured to translate the output from the digital integrator to the analog input for the delay cells in the sampling system for correcting a timing mismatch in the sampling system.

In an embodiment, the calibration unit further includes a bias generator configured to generate a bias voltage based on the analog input.

In an embodiment, the analog input includes a current value.

In an embodiment, the number of cycles of the oscillator is tunable in order to enhance calibration accuracy.

In an embodiment, the oscillator is configured to revolve around in the number of cycles.

In an embodiment, the analog input is accessible and tunable via an external terminal.

In an embodiment, a sampling system includes sampling cells and calibration units connected to the sampling cells and configured to correct a plurality of timing mismatches in the sampling cells, where the sampling cells are distributed into sampling channels, and where the sampling cells in the sampling channels are driven by sampling clock pulses with respective phase offsets.

In an embodiment, one of the calibration units includes an oscillator having a number of cycles, a digital counter configured to capture a count value that is representative of a time duration to complete the number of cycles, a digital integrator configured to accumulate a difference between a predetermined count value and the captured count value, and a digital to analog converter (DAC) configured to translate an output from the digital integrator into an analog input for delay cells in one of the sampling cells of the sampling system for correcting one of the timing mismatches in the sampling system.

In an embodiment, the one of the calibration units further includes a bias generator configured to generate a bias voltage based on the analog input.

In an embodiment, the analog input includes a current value.

In an embodiment, the number of cycles of the oscillator is tunable in order to enhance calibration accuracy.

In an embodiment, the oscillator is configured to revolve around in the number of cycles.

In an embodiment, the analog input is accessible and tunable via an external terminal.

In an embodiment, the sampling cells are evenly distributed into the sampling channels, each of the sampling channels contains an identical number of sampling cells, where all sampling cells in each of the sampling channels are driven by a sampling clock pulse with a specific phase offset of the sampling clock pulses.

In an embodiment, the sampling cells are configured to capture and store analog values at discrete time intervals, each of the sampling cells is configured to operate in one of a sampling mode and a readout mode, and delay cells in all sampling cells in each of the sampling channels are configured to propagate one of the sampling clock pulses sequentially.

In an embodiment, each of the sampling cells comprises a sampling switch, a capacitor, a buffer, a readout switch, and a delay cell, wherein the sampling switch and the capacitor are configured to capture and store analog data, wherein the readout switch and the buffer are configured to read the stored analog data.

In an embodiment, data that is read out from the sampling channels is sequentially arranged in a digital domain.

In an embodiment, the sampling system further includes a clock circuit configured to generate the sampling clock pulses with the respective phase offsets, where the clock circuit includes an interpolator configured to generate the respective phase offsets for the sampling clock pulses that are tunable to adjust timing delays between the sampling channels.

In an embodiment, a method for sampling involves generating sampling clock pulses with respective phase offsets, calibrating sampling cells distributed in sampling channels to correct timing mismatches in the sampling channels, and driving the sampling cells distributed in the sampling channels using the sampling clock pulses to capture and store analog values at discrete time intervals.

Other aspects in accordance with the invention will become apparent from the following detailed description, taken in conjunction with the accompanying drawings, illustrated by way of example of the principles of the invention.

BRIEF DESCRIPTION OF THE DRAWINGS

Throughout the description, similar reference numbers may be used to identify similar elements.

DETAILED DESCRIPTION

Figure 1:
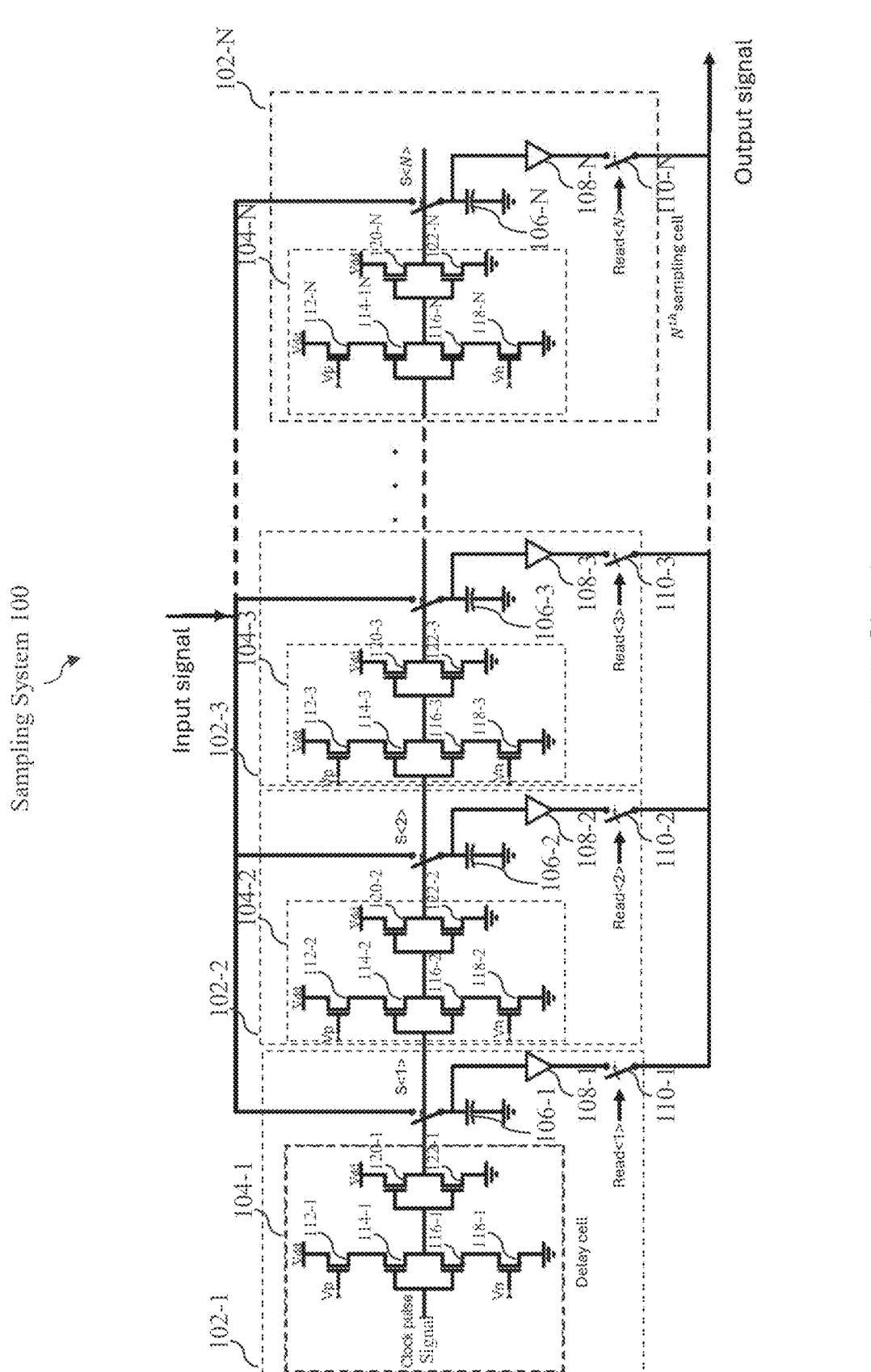
FIG. 1 depicts a sampling system with an array of high-speed samplers and memory buffers/delay cells.

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment", "an embodiment", or similar language means that a particular feature, structure, or characteristic described in connection with the indicated embodiment is included in at least one embodiment of the present invention. Thus, the phrases "in one embodiment", "in an embodiment", and similar language throughout this specification may, but do not necessarily, all refer to the same embodiment.

Conventional high-speed signal acquisition technologies are often constrained by power requirements, complexity, and physical area. An alternative approach involves the use of fast transient digitizers, which employ an array of high-speed samplers and memory buffers to sample and store analog signals efficiently. The stored data can subsequently be read at a lower speed, reducing the need for high-speed data processing systems and reducing overall system complexity and power consumption.

FIG. 1 depicts a sampling system 100 with an array of high-speed samplers and memory buffers/delay cells. As depicted in FIG. 1, the sampling system 100 includes a sampler array with N (N being a positive integer) sampling cells 102-1, . . . , 102-N. Each of the sampling cells 102-1, . . . , 102-N includes a sampling switch S<1>, . . . , or S<N>, a capacitor 106-1, . . . , or 106-N, a buffer 108-1, . . . , or 108-N, a readout switch 110-1, . . . , or 110-N, and a delay cell 104-1, . . . , or 104-N. The sampling switches S<1>, . . . , S<N> are controlled by the array of delay cells 104-1, . . . , 104-N. Specifically, each of the sampling switches S<1>, . . . , S<N> is controlled by or through a corresponding delay cell 104-1, . . . or 104-N. Each of the delay cells 104-1, . . . , 104-N includes inverter cells that are connected in a cascaded manner and formed by corresponding transistors 112-1, . . . , or 112-N, 114-1, . . . , or 114-N, 116-1, . . . , or 116-N, 118-1, . . . , or 118-N, 120-1, . . . , or 120-N, and 122-1, . . . , or 122-N, and a time delay $t_d$ introduced by these inverters determines the delay of the delay cells 104-1, . . . , 104-N.

The sampling system 100 can operate in two primary operation modes, which are a sampling mode and a readout mode. The maximum effective sampling rate that can be achieved in the sampling system 100 is mainly limited by the intrinsic delay from the inverters in the delay cells 104-1, . . . , 104-N. To address these limitations, a multi-channel sampling scheme can be used to improve the effective sampling rate, bandwidth, and overall performance and to reduce design constraints on analog blocks.

Figure 2:
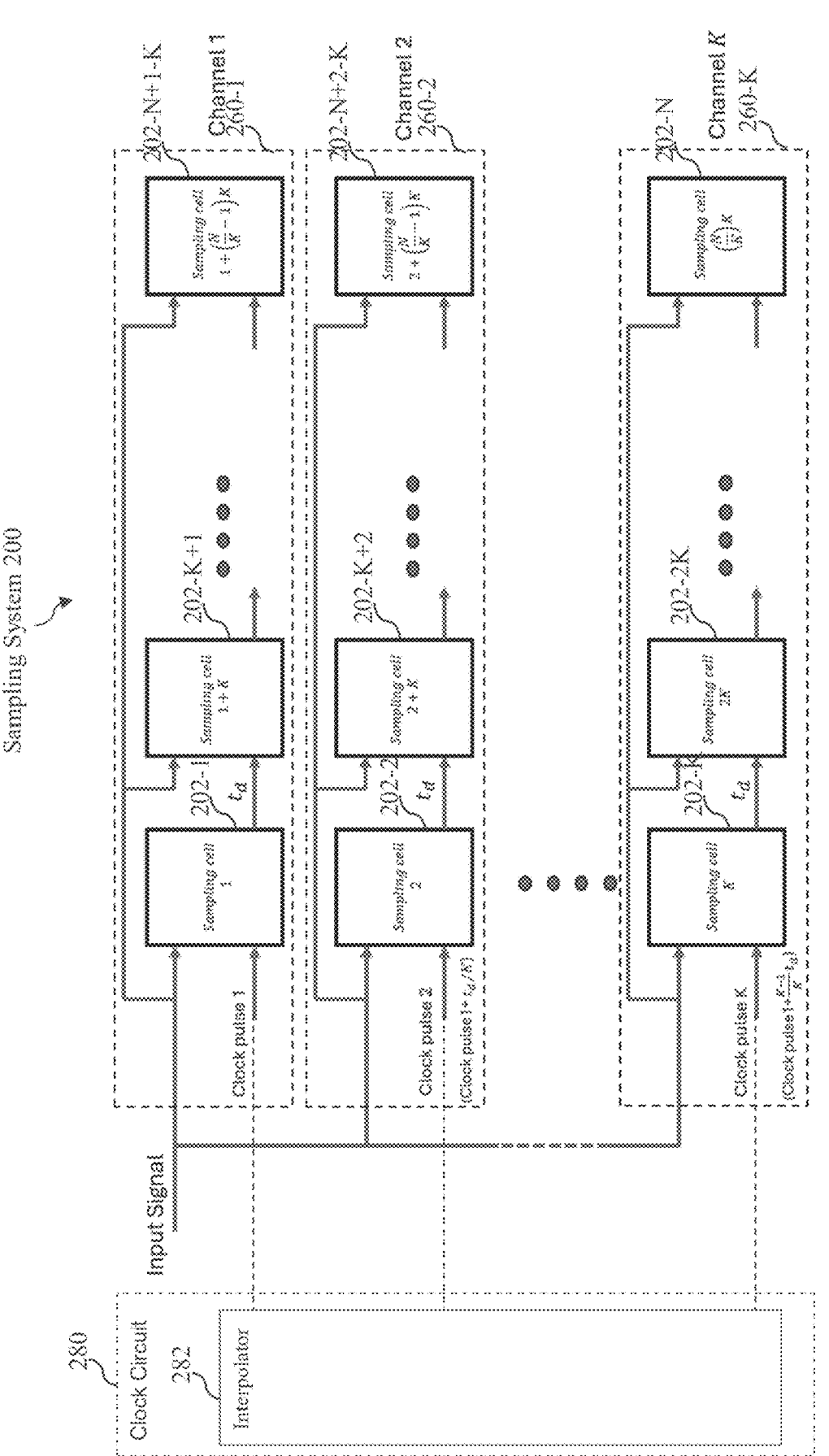
FIG. 2 depicts a multi-channel sampling system in accordance to an embodiment of the invention.

FIG. 2 depicts a multi-channel sampling system 200 in accordance to an embodiment of the invention. In the embodiment depicted in FIG. 2, the multi-channel sampling system 200 includes a sampler array with N (N being a positive integer) sampling cells 202-1, . . . , 202-N that are divided into K (K being a positive integer) number of sampling channels or banks 260-1, . . . , 260-K. The sampling cells 202-1, . . . , 202-N may be implemented in hardware (e.g., circuits), software, firmware, or a combination thereof. In some embodiments, at least one of the sampling cells 202-1, . . . , 202-N are implemented similarly to or the same as the sampling cells 102-1, . . . , 102-N of the sampling system 100 shown in FIG. 1. For example, at least one of the sampling cells 202-1, . . . , 202-N includes a sampling switch, a capacitor, a buffer, a readout switch, and a delay cell (e.g., the delay cell 104-1, . . . , or 104-N depicted in FIG. 1). The sampling switches can be controlled by the array of delay cells (e.g., the delay cells 104-1, . . . , 104-N depicted in FIG. 1). For example, each of the sampling switches is controlled by a corresponding delay cell. In some embodiments, each of the delay cells (e.g., the delay cells 104-1, . . . , 104-N depicted in FIG. 1) includes inverter cells that are connected in a cascaded manner and formed by corresponding transistors, and a time delay, $t_d$, introduced by these inverters determines the delay of the delay cells (e.g., the delay cells 104-1, . . . , 104-N depicted in FIG. 1). The multi-channel sampling system 200 depicted in FIG. 2 can be used to capture high-speed analog signals and reproduce the captured high-speed analog signals in a slow and stretched manner. The read-out signal can be digitized using relatively low speed ADCs. Replacing high speed ADCs with relatively low speed ADCs can significantly reduce the power consumption and cost of a high-speed signal acquisition system. The multi-channel sampling system 200 can be used in various applications, such as industrial applications, medical applications, computer applications, and/or consumer or enterprise applications. Although the illustrated multi-channel sampling system 200 is shown with certain components and described with certain functionality herein, other embodiments of the communications system may include fewer or more components to implement the same, less, or more functionality. For example, the multi-channel sampling system 200 may include a clock circuit 280 configured to generate sampling clock pulses clock pulse 1, . . . , clock pulse K with respective phase offsets for the sampling channels or banks 260-1, . . . , 260-K. In some embodiments, the clock circuit 280 includes an interpolator 282 configured to generate the respective phase offsets for the sampling clock pulses clock pulse 1, . . . , clock pulse K. In some embodiments, the interpolator 282 is configured to generate the respective phase offsets that are tunable to adjust timing delays between the sampling channels 260-1, . . . , 260-K. In another example, although the sampling cells 202-1, . . . , 202-N are shown in FIG. 2 as being connected in certain topology, the network topology of the multi-channel sampling system 200 is not limited to the topology shown in FIG. 2.

In the embodiment depicted in FIG. 2, the sampling cells 202-1, . . . 202-N are divided into K number of sampling channels or banks 260-1, . . . , 260-K, where each sampling channel 260-1, . . . , or 260-K includes N/K sampling cells and each sampling channel receives a pulse signal with a precisely controlled propagation delay/time offset of $t_d/K$. By implementing the multi-channel sampling scheme, the sampling cells 202-1, . . . , 202-N are evenly distributed across a number of sampling channels 260-1, . . . , 260-K such that each of the sampling channels contains an identical number of sampling cells. Specifically, the sampling channel 260-1 includes the sampling cells 202-1, 202-K+1, . . . , 202-N+1-K, the sampling channel 260-2 includes the sampling cells 202-2, 202-K+2, . . . , 202-N+2-K, and the sampling channel 260-K includes the sampling cells 202-K, 202-2K, . . . , 202-N.

In the embodiment depicted in FIG. 2, the clock pulse (also referred to as clock pulse 1) generated for the first sampling channel 260-1 propagates through the sampling cells $$\left\{1, [1+K], [1+2K] \ ... \ \left[1+\left(\frac{N}{K}-1\right)K\right]\right\}202-1,$$

$$202-K+1, \ ... \ , 202-N+1-K$$

with a propagation delay of $t_d$. Similarly, the $K^{th}$ sampling channel 260-K receives a clock pulse K with a propagation delay/time offset of $$\frac{K-1}{K}t_d$$

that propagates through the sampling cells $$\left\{K, 2K, 3K \ ... \ \left(\frac{N}{K}\right)K\right\}202-K, 202-2K, \ ... \ , 202-N.$$

Consequently, the clock pulse propagating through the respective sampling channel samples every $K^{th}$ sampling cell. Because the clock pulse in each sampling channel is at a precise propagation delay/time offset, a significantly higher effective sampling rate of $K/t_d$ or $K*f_s$ can be achieved while maintaining a low timing jitter. The multi-channel sampling system 200 can operate in two primary operation modes, which are a sampling mode and a readout mode.

A challenge associated with the multi-channel sampling system 200 is the timing mismatch of the sampling clock pulse between each sampling bank or channel 260-1, . . . , or 260-K. Even though the interpolator 282 can provide precise offsets, the clock pulse propagates through an array of inverters in the respective banks. The propagation delay of an inverter is susceptible to process, voltage and temperature (PVT) variations. Because of the PVT variations, the sampling delay can vary across the sampling banks or channels 260-1, . . . , 260-K and will result in $$\frac{t_d}{K} \pm \Delta t_d.$$

Figure 3:
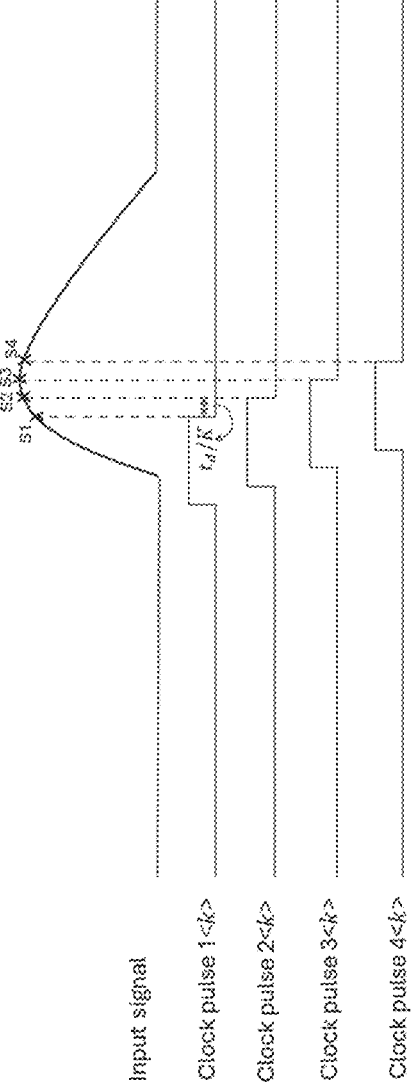
FIG. 3 illustrates an example signal timing diagram of a sampling process of the multi-channel sampling system depicted in FIG. 2 where ideal clock pulses are considered.
Figure 4:
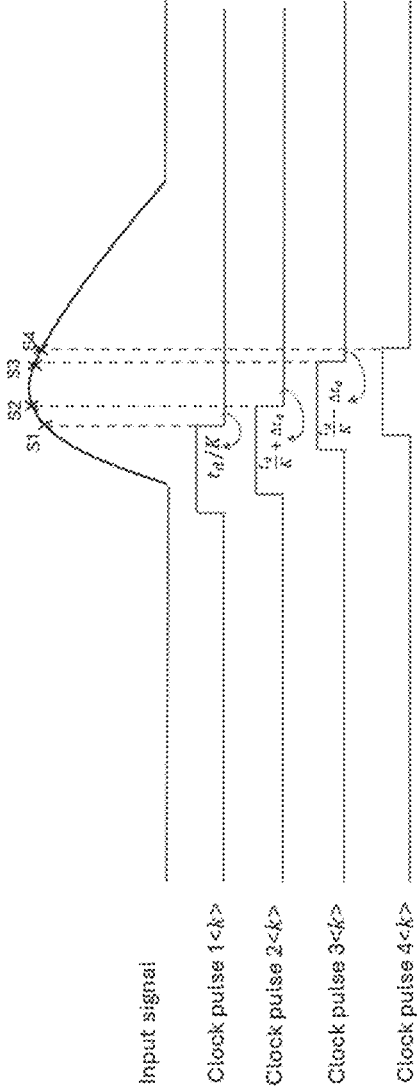
FIG. 4 illustrates an example signal timing diagram of a sampling process of the multi-channel sampling system depicted in FIG. 2 where non-ideal/realistic clock pulses are considered.

This timing mismatch in a sampling clock can result in a non-uniform sampling and impact a precise capturing of the input signal. FIG. 3 illustrates an example signal timing diagram of a sampling process of the multi-channel sampling system 200 depicted in FIG. 2 where ideal clock pulses are considered. In the example signal timing diagram illustrated in FIG. 3, a clock pulse signal of pulse width $t_{pw}$ is applied to every sampling channel 260-1, . . . , or 260-4 but with a time offset of $t_d/K$, four clock pulses that arrived at $k^{th}$ sampling cell of each bank are illustrated, and the delay between each pulse is precisely $t_d/K$. The clock pulses uniformly captures the samples, S1, S2, S3 and S4. An appropriate readout mechanism can be used to accurately reconstruct the captured signals. However, in a non-ideal scenario, the sampling clock delay can vary due to multiple factors. FIG. 4 illustrates an example signal timing diagram of a sampling process of the multi-channel sampling system 200 depicted in FIG. 2 where non-ideal/realistic clock pulses are considered. In the example signal timing diagram illustrated in FIG. 4, a clock pulse signal of pulse width $t_{pw}$ is applied to every sampling channel 260-1, . . . , or 260-4 but with a time offset of $t_d/K$ and four clock pulses that arrived at $k^{th}$ sampling cell of each bank are illustrated. The delay offset between Clock pulse2<k> and Clock pulse3<k> deviates from $$t_d/K \ to \ \frac{t_d}{K} + \Delta t_d.$$

Similarly, the delay offset between Clock pulse3<k> and Clock pulse4<k> has deviated to $$\frac{t_d}{K} - \Delta t_d,$$

which results in a non-uniform sampling of the input signals and thus capturing incorrect samples for S1, S2, S3 and S4.

To precisely sample the signal, it must be ensured that the $$\Delta t_d \ll \frac{t_d}{K}.$$

In accordance with an embodiment of the invention, a digital calibration mechanism is used in a multi-channel sampling system (e.g., the multi-channel sampling system 200 depicted in FIG. 2) to minimize the timing mismatches. A calibration unit or block is incorporated in every sampling channel or bank to monitor and correct the timing variation.

Figure 5:
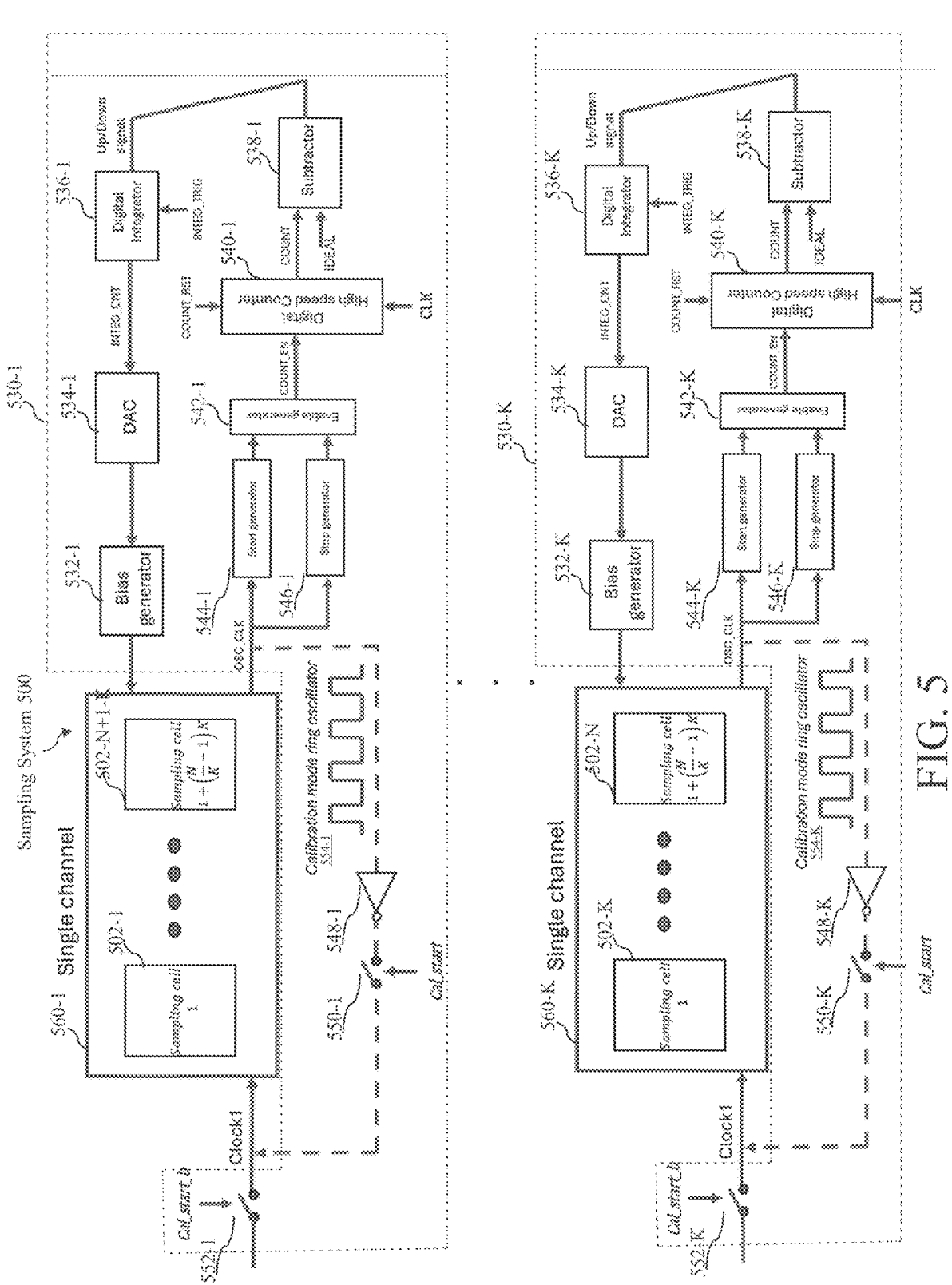
FIG. 5 depicts a multi-channel sampling system with calibration units/blocks in accordance to an embodiment of the invention.

FIG. 5 depicts a multi-channel sampling system 500 with calibration units or blocks in accordance to an embodiment of the invention. In the embodiment depicted in FIG. 5, the multi-channel sampling system 500 includes a sampler array with N (N being a positive integer) sampling cells 5 02-1, . . . , 502-N that are divided into K (K being a positive integer) number of sampling channels or banks 560-1, . . . , 560-K and corresponding K calibration units or blocks 530-1, . . . , 530-K connected to the sampling cells 560-1, . . . , 560-K. In some embodiments, the K calibration units or blocks 530-1, . . . , 530-K are configured to correct timing mismatches in the sampling cells 560-1, . . . , 560-K. The sampling cells 502-1, . . . , 502-N may be implemented in hardware (e.g., circuits), software, firmware, or a combination thereof. In some embodiments, at least one of the sampling cells 502-1, . . . , 502-N are implemented similarly to or the same as the sampling cells 102-1, . . . , 102-N of the sampling system 100 shown in FIG. 1. For example, at least one of the sampling cells 502-1, . . . , 502-N includes a sampling switch, a capacitor, a buffer, a readout switch, and a delay cell (e.g., the delay cell 104-1, . . . , or 104-N depicted in FIG. 1). The sampling switches can be controlled by the array of delay cells (e.g., the delay cells 104-1, . . . , 104-N depicted in FIG. 1). For example, each of the sampling switches is controlled by a corresponding delay cell. In some embodiments, each of the delay cells (e.g., the delay cells 104-1, . . . , 104-N depicted in FIG. 1) includes inverter cells that are connected in a cascaded manner and formed by corresponding transistors, and a time delay, $t_d$, introduced by these inverters determines the delay of the delay cells (e.g., the delay cells 104-1, . . . , 104-N depicted in FIG. 1). The multi-channel sampling system 500 depicted in FIG. 5 can be used to capture high-speed analog signals and reproduce the captured high-speed analog signals in a slow and stretched manner. The read-out signal can be digitized using relatively low speed ADCs. Replacing high speed ADCs with relatively low speed ADCs can significantly reduce the power consumption and cost of a high-speed signal acquisition system. The multi-channel sampling system 500 can be used in various applications, such as industrial applications, medical applications, computer applications, and/or consumer or enterprise applications. Although the illustrated multi-channel sampling system 500 is shown with certain components and described with certain functionality herein, other embodiments of the communications system may include fewer or more components to implement the same, less, or more functionality. For example, the multi-channel sampling system 500 may include a clock circuit configured to generate sampling clock pulses clock pulse 1, . . . , clock pulse K with respective phase offsets for the sampling channels or banks 560-1, . . . , 560-K. In some embodiments, the clock circuit includes an interpolator configured to generate the respective phase offsets for the sampling clock pulses clock pulse 1, . . . , clock pulse K. In some embodiments, the interpolator is configured to generate the respective phase offsets that are tunable to adjust timing delays between the sampling channels 560-1, . . . , 560-K. In another example, although the sampling cells 502-1, . . . , 502-N are shown in FIG. 5 as being connected in certain topology, the network topology of the multi-channel sampling system 500 is not limited to the topology shown in FIG. 5.

In the embodiment depicted in FIG. 5, the sampling cells 502-1, . . . 502-N are divided into K number of sampling channels or banks 560-1, . . . , 560-K, where each sampling channel 560-1, . . . , or 560-K includes N/K sampling cells and each sampling channel receives a pulse signal with a precisely controlled propagation delay/time offset of $t_d$/K. By implementing the multi-channel sampling scheme, the sampling cells 502-1, . . . , 502-N are evenly distributed across a number of sampling channels 560-1, . . . , 560-K such that each of the sampling channels contains an identical number of sampling cells. Specifically, the sampling channel 560-1 includes the sampling cells 502-1, 502-K+1, . . . , 502-N+1-K, and the sampling channel 560-K includes the sampling cells 502-K, 502-2K, . . . , 502-N. In the embodiment depicted in FIG. 5, the clock pulse (also referred to as clock pulse 1) generated for the first sampling channel 560-1 propagates through the sampling cells $$\left\{1, [1+K], [1+2K] \ldots \left[1+\left(\frac{N}{K}-1\right)K\right]\right\}502-1,$$
$$502-K+1, \ldots, 502-N+1-K$$

with a propagation delay of $t_d$. Similarly, the K$^{th}$ sampling channel 560-K receives a clock pulse K with a propagation delay/time offset of $$\frac{K-1}{K}t_d$$

that propagates through the sampling cells $$\left\{K, 2K, 3K \ldots \left(\frac{N}{K}\right)K\right\}502-K, 502-2K, \ldots, 502-N.$$

Consequently, the clock pulse propagating through the respective sampling channel samples every K$^{th}$ sampling cell. Because the clock pulse in each sampling channel is at a propagation delay/time offset, a significantly higher effective sampling rate of K/$t_d$ or K*$f_s$ can be achieved while maintaining a low timing jitter. The multi-channel sampling system 500 can operate in two primary operation modes, which are a sampling mode and a readout mode.

In the embodiment depicted in FIG. 5, each of the sampling channels or banks 560-1, . . . , 560-K is connected to a corresponding calibration unit or block 530-1, . . . , or 530-K. Each calibration unit or block can include various digital clocks, such as, counters, subtractors, and logic circuits. In the embodiment depicted in FIG. 5, the calibration unit or block 530-1 incudes a bias generator 532-1, a Digital to Analog Converter (DAC) 534-1, a digital integrator that is implemented as an up/down counter 536-1, a subtractor 538-1, a digital high-speed counter 540-1, an enable generator 542-1, a start generator 544-1, a stop generator 546-1, an inverter 548-1, a switch 550-1, and a switch 552-1, while the calibration unit or block 530-K incudes a bias generator 532-K, a DAC 534-K, a digital integrator that is implemented as an up/down counter 536-K, a subtractor 538-K, a digital high-speed counter 540-K, an enable generator 542-K, a start generator 544-K, a stop generator 546-K, an inverter 548-K, a switch 550-K, and a switch 552-K.

In the embodiment depicted in FIG. 5, the switch 550-1 and the inverter 548-1 form an oscillator 554-1 (e.g., a ring oscillator). In some embodiments, the oscillator 554-1 has (e.g., revolves around) a specific number of cycles. In some embodiments, the number of cycles of the oscillator 554-1 is tunable in order to enhance calibration accuracy. In some embodiments, the digital high-speed counter 540-1 is configured to capture a count value that is representative of a time duration to complete the specific number of cycles. In some embodiments, the digital integrator that is implemented as the up/down counter 536-1 is configured to accumulate a difference between a predetermined count value and the captured count value. In some embodiments, the DAC 534-1 is configured to translate or convert an output from the digital integrator 536-1 into an analog input for delay cells (e.g., the delay cells 104-1, 104-K+1, . . . , 104-N+1-K depicted in FIG. 1) in the multi-channel sampling system 500. In some embodiments, the DAC 534-1 is further configured to translate or convert the output from the digital integrator 536-1 into the analog input for the delay cells (e.g., the delay cells 104-1, 104-K+1, . . . , 104-N+1-K depicted in FIG. 1) in the multi-channel sampling system 500 for correcting a timing mismatch in the multi-channel sampling system 500 (e.g., for correct timing mismatches in the sampling channels 560-1, . . . , 560-K). In some embodiments, the bias generator 532-1 is configured to generate a bias voltage based on the analog input. In some embodiments, the analog input includes a current value. In some embodiments, the analog input is accessible and tunable via an external terminal.

In the embodiment depicted in FIG. 5, the switch 550-K and the inverter 548-K form an oscillator 554-K (e.g., a ring oscillator). In some embodiments, the oscillator 554-K has (e.g., revolves around) a specific number of cycles. In some embodiments, the number of cycles of the oscillator 554-K is tunable in order to enhance calibration accuracy. In some embodiments, the digital high-speed counter 540-K is configured to capture a count value that is representative of a time duration to complete the specific number of cycles. In some embodiments, the digital integrator that is implemented as the up/down counter 536-1 is configured to accumulate a difference between a predetermined count value and the captured count value. In some embodiments, the DAC 534-K is configured to translate or convert an output from the digital integrator 536-K into an analog input for delay cells (e.g., the delay cells 104-K, 104-2K, . . . , 104-N depicted in FIG. 1) in the multi-channel sampling system 500. In some embodiments, the DAC 534-K is further configured to translate or convert the output from the digital integrator 536-K into the analog input for the delay cells (e.g., the delay cells 104-K, 104-2K, . . . , 104-N depicted in FIG. 1) in the multi-channel sampling system 500 for correcting a timing mismatch in the multi-channel sampling system 500 (e.g., for correct timing mismatches in the sampling cells 560-1, . . . , 560-K). In some embodiments, the bias generator 532-K is configured to generate a bias voltage based on the analog input. In some embodiments, the analog input includes a current value. In some embodiments, the analog input is accessible and tunable via an external terminal.

In the embodiment depicted in FIG. 5, a signal COUNT_RST is inputted into a respective digital high-speed counter 540-1, . . . , or, 540-K with a clock signal CLK, while a signal OSC_CLK is outputted from a respective sampling channel or bank 560-1, . . . , or 560-K. The COUNT_EN signal kickstarts the digital high-speed counter 540-1 and disables the digital high-speed counter 540-1 after M cycles. A respective enable generator 542-1, . . . , or 542-K generates a COUNT_EN signal that can kickstart or disable a respective digital high-speed counter 540-1, . . . , or 540-K and/or trigger the clock for a respective digital integrator (e.g., up-down counter) 536-1, . . . , or 536-K, INTEG_TRIG. A respective digital high-speed counter 540-1, . . . , or, 540-K can generate a COUNT signal, which is compared with an IDEAL signal at a respective subtractor 538-1, . . . , or, 538-K.

An example calibration of the calibration unit or block 530-1 is described as follows. The calibration unit or block 530-1 operates in a separate calibration mode before sampling begins. The calibration mode is initiated when a CAL_START signal goes logic high, which configures the delay cells (e.g., the delay cells 104-1, 104-K+1, . . . , 104-N+1-K depicted in FIG. 1) in the sampling channel 560-1 to the ring oscillator 554-1 setup by connecting the output of the last delay-cell (e.g., the delay cell 104-N+1-K depicted in FIG. 1) in the sampling channel 560-1 to the input of the first delay-cell (e.g., the delay cell 104-1 depicted in FIG. 1) of the sampling channel 560-1. Once the ring oscillator 554-1 is initiated, the start generator 544-1 generates a signal to enable the digital high-speed counter 540-1, which is clocked by a reference clock of frequency $f_{ref}$. The period of the ring oscillator 554-1 is determined by the number $$\frac{N}{K}$$

of delay-cells in the sampling channel 560-1 and can be written as $$\frac{N}{K} 2t_d.$$

In an embodiment, the ring oscillator 554-1 is disabled upon reaching a predetermined period count M. For example, after reaching M cycles, the ring oscillator 554-1 is frozen, which triggers the stop generator 546-1 to pause the digital high-speed counter 540-1. In an embodiment, the count value obtained from this process, $$\frac{MN}{K} 2t_d f_{ref},$$

is compared against an ideal count value, for example, using the digital subtractor 538-1. The sign bit of the subtractor output can be used as the output of the comparison. The comparison output is connected to the digital integrator (e.g., up-down counter) 536-1, whose output is converted to an analog voltage using the DAC 534-1. In an embodiment, the DAC output regulates the current starving mechanism of the delay-cells using the local bias generator 532-1. The example calibration of the calibration unit or block 530-1 is performed in other calibration units or blocks 530-2, . . . , 530-K. This process ensures precise alignment of trigger signals across all sampling banks 560-1, . . . , 560-K. In an embodiment, the factor M of the ring oscillator 554-1, . . . , or 554-K is tunable such that it can be changed based on the precision requirement (Not illustrated in FIG. 5 for simplicity). A better precision can be obtained while using a higher value of M. However, it can also reduce the bandwidth of the calibration loop as the ring oscillator takes longer time to complete M cycles.

Figure 6:
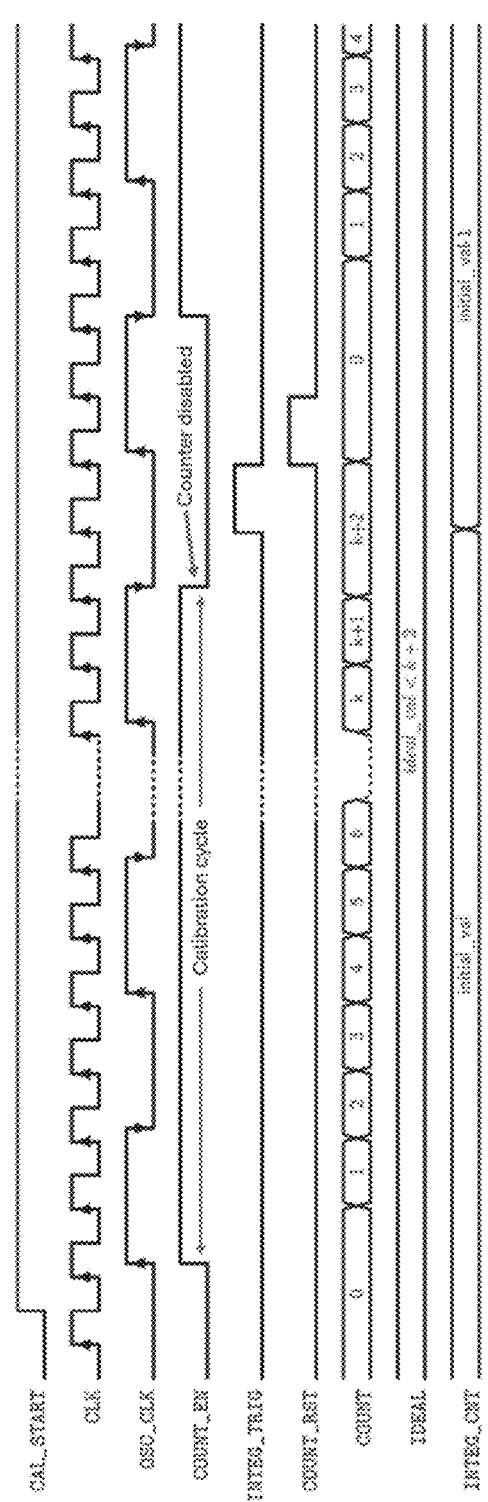
FIG. 6 illustrates an example signal timing diagram of a calibration process of the multi-channel sampling system depicted in FIG. 5.
Figure 7:
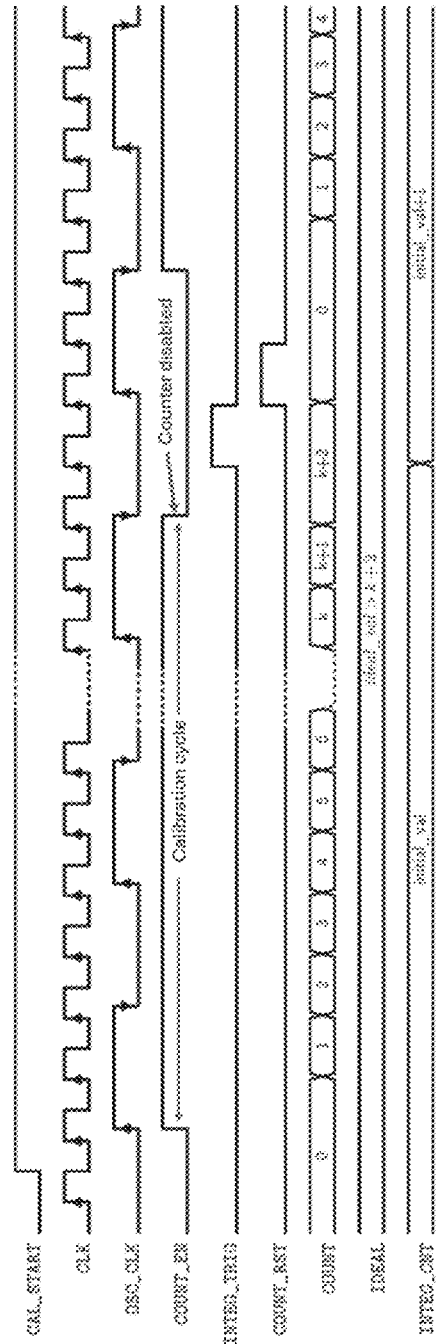
FIG. 7 illustrates an example signal timing diagram of a calibration process of the multi-channel sampling system depicted in FIG. 5.
Figure 8:
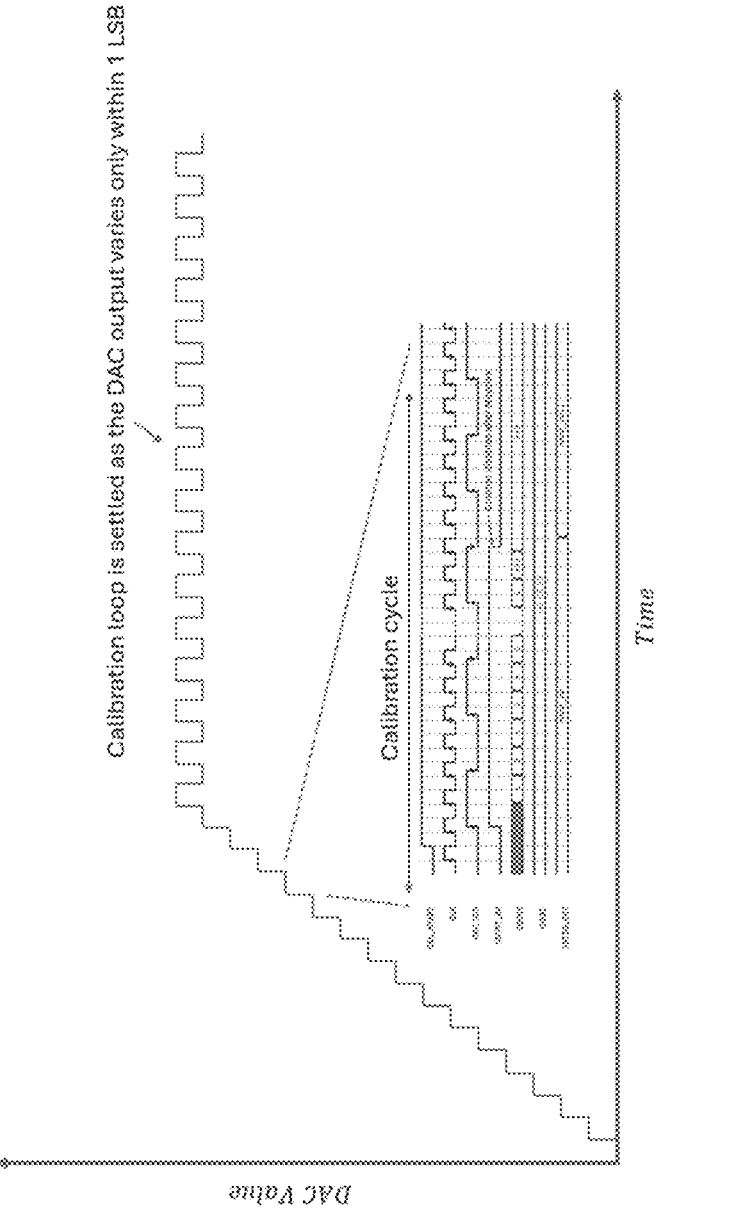
FIG. 8 illustrates an example DAC output of the multi-channel sampling system depicted in FIG. 5.

FIG. 6 illustrates an example signal timing diagram of a calibration process of the multi-channel sampling system 500 depicted in FIG. 5. The CAL_START signal initiates the calibration. The COUNT_EN signal kickstarts the digital high-speed counter 540-1 and disables the digital high-speed counter 540-1 after M cycles. The falling edge of COUNT_EN triggers the clock for the digital integrator (e.g., up-down counter) 536-1, INTEG_TRIG. Similarly, the COUNT_EN signal kickstarts the digital high-speed counter 540-K and disables the digital high-speed counter 540-K after M cycles, while the falling edge of COUNT_EN triggers the clock for the digital integrator (e.g., up-down counter) 536-K, INTEG_TRIG. The counter output, k+2, is compared against the ideal count, val. If ideal_val<k+2, the digital integrator (up-down counter) 536-1 decrements, as illustrated in FIG. 6. FIG. 7 illustrates an example signal timing diagram of a calibration process of the multi-channel sampling system 500 depicted in FIG. 5 (e.g., when ideal$_{val}$>k+2). The digital integrator (up-down counter) 536-1 increments if the case is opposite (when ideal$_{val}$>k+2, illustrated in FIG. 7). This entire calibration process defines one complete calibration cycle. The digital high-speed counter 540-1 must be set to zero before the start of the next calibration cycle. This is achieved by COUNT_RST (inputted into the digital high-speed counter 540-1, . . . , or, 540-K with the clock signal CLK), which is triggered by the falling edge of INTEG_TRIG. The entire calibration cycle is repeated until the high-speed counter output reaches the ideal value, ideal_val, which results in the DAC output voltage, the analog equivalent of the digital integrator output, settling to a final value with only one LSB toggling every calibration cycle. FIG. 8 illustrates an example DAC output of the multi-channel sampling system 500 depicted in FIG. 5. As illustrated in FIG. 8, the calibration loop is settled as the DAC output varies only within 1 LSB and the timing mismatches can be minimized.

Figure 9:
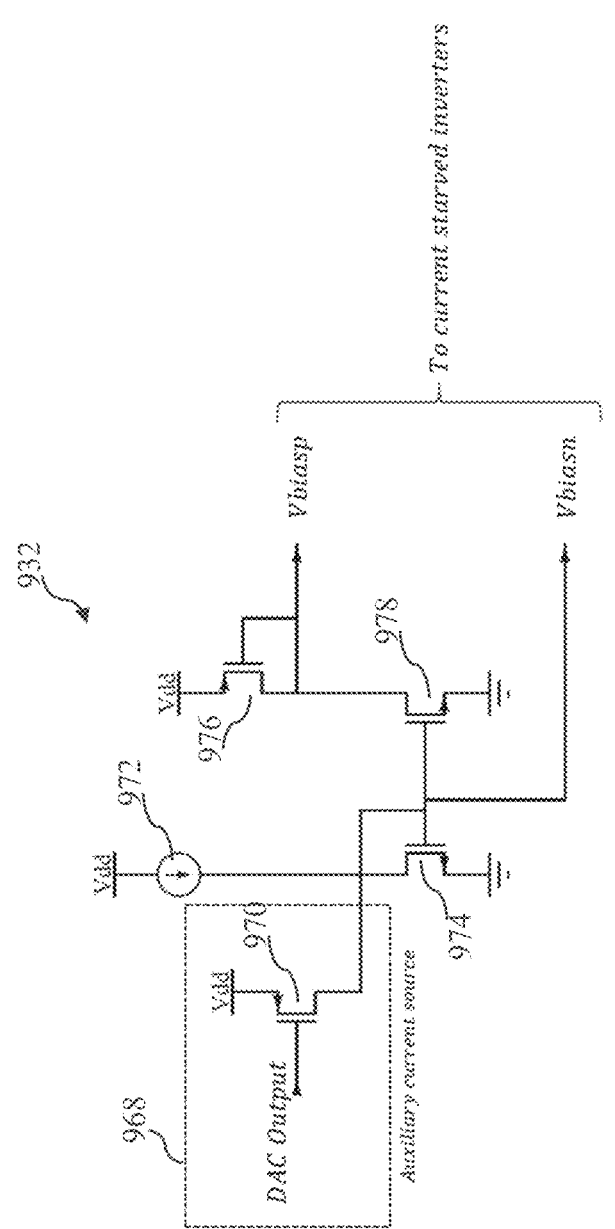
FIG. 9 depicts an auxiliary current source that controls a bias generator.

In some embodiments, the DAC output controls a bias generator (e.g., the bias generator 532-1, . . . , or 532-K) of the multi-channel sampling system 500 depicted in FIG. 5) through an auxiliary current source. FIG. 9 depicts an auxiliary current source 968 that controls a bias generator 932. In the embodiment depicted in FIG. 9, the auxiliary current source 968 includes a transistor 970 and the bias generator 932 includes a current source 972 and transistors 974, 976, 978. Depending on the DAC voltage, the auxillary current source 968 either increase or decrease the current going to the bias generator 932, which results in adjusting the bias voltages, Vbiasp and Vbiasn by adjusting the current in each bank. The DAC output signal for all banks can also be connected to an external pad. The main advantage is that the user will be able to monitor the signals externally. Additionally, if the calibration loop does not operate as expected, this pin can be used to manually override the DAC signal to the required voltage.

Figure 10:
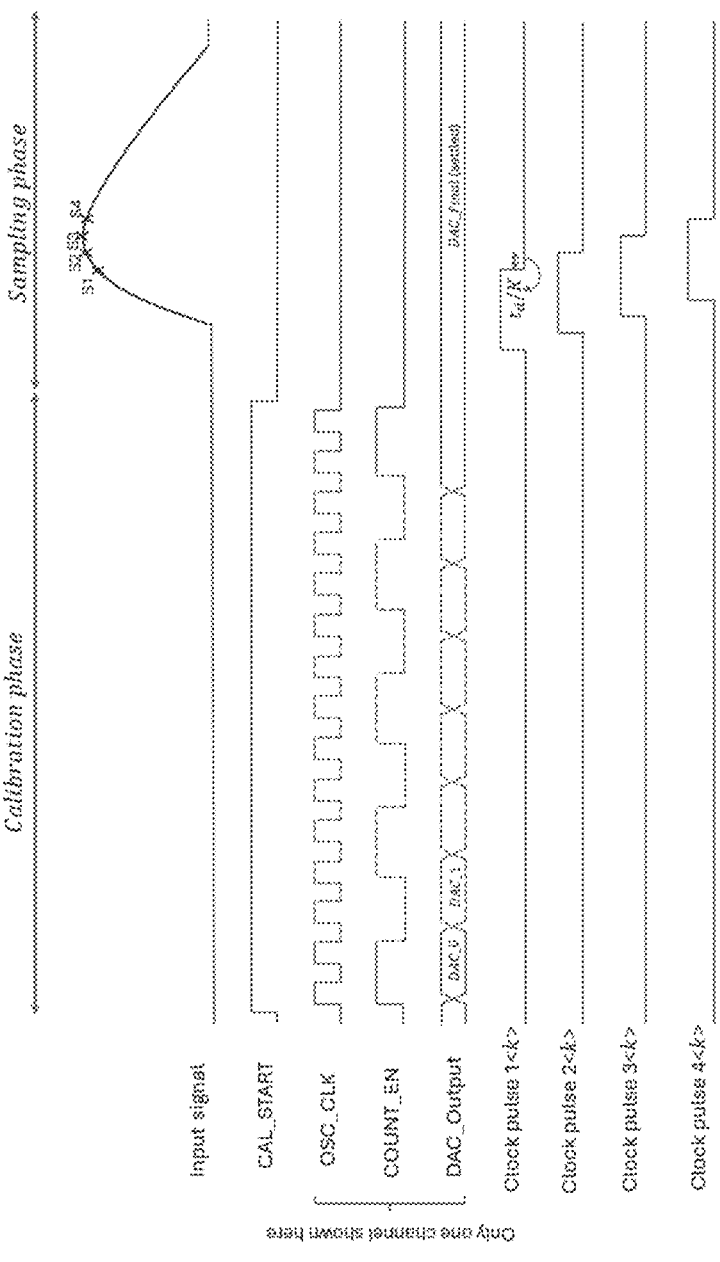
FIG. 10 illustrates an example signal timing diagram of a calibration phase and a sample phase of the multi-channel sampling system depicted in FIG. 5.

FIG. 10 illustrates an example signal timing diagram of a calibration phase and a sample phase of the multi-channel sampling system 500 depicted in FIG. 5. The calibration phase is initiated before the sampling phase. When the signal CAL_START goes high, the calibration process/phase starts. The ring oscillator 554-1, . . . , or 554-K in each sampling channel 560-1, . . . , or 560-K is initiated and the DAC is updated in every calibration cycle. Once the output of the DAC is settled, the calibration is stopped by setting the signal CAL_START to low. Because the timing mismatch for each bank can drift because of several factors, the settled DAC output value can be different for each bank. As a result of calibration, the mismatch effect is significantly reduced and the sampling delay, $$\frac{t_d}{K} \pm \Delta t_d$$

is corrected to $$\frac{t_d}{K}.$$

As illustrated in FIG. 10, four clock pulses that arrived at k$^{th}$ sampling cell of each bank and a uniform sampling is achieved and thereby precisely capturing the samples, S1, S2, S3 and S4.

Figure 11:
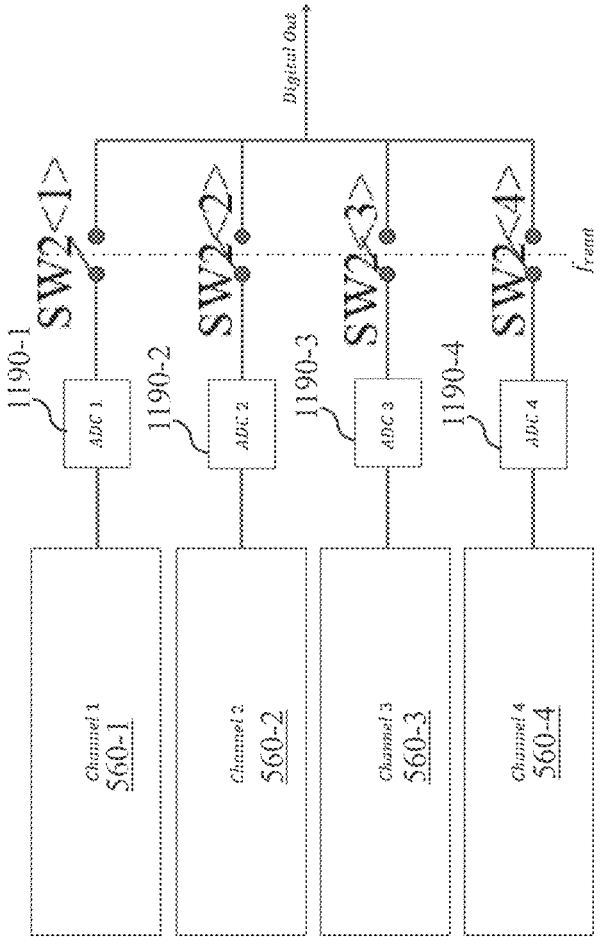
FIG. 11 illustrates an implementation of a digital domain reconstruction.

The readout operation of the multi-channel sampling system 500 depicted in FIG. 5 can be implemented in a similar fashion as the sampling system 100 depicted in FIG. 1. In an embodiment, each sampling channel 560-1, . . . , or 560-K is read out using one hot decoder. Because the sequential samples {1, 2, 3 . . . N} are spread across multiple sampling channels (as illustrated in FIG. 5), the sequential samples {1, 2, 3 . . . N} can be either reconstructed or re-arranged in digital domain or in analog domain. Reconstruction in digital domain is generally preferred as there the digitized data has lower noise and better linearity. FIG. 11 illustrates an implementation of a digital domain reconstruction. In FIG. 11, there is an additional switch, SW2<1:4>, controlled by a read signal f$_{read}$ and connected to the output of each sampling channel 560-1, . . . , or 560-4 to re-arrange the samples. In FIG. 11, ADCs 1190-1, 1190-2, 1190-3, 1190-4 are used to perform analog-to-digital conversions and the switches SW2<1>, SW2<2>, SW2<3>, SW2<4> output a digital data output.

Figure 12:
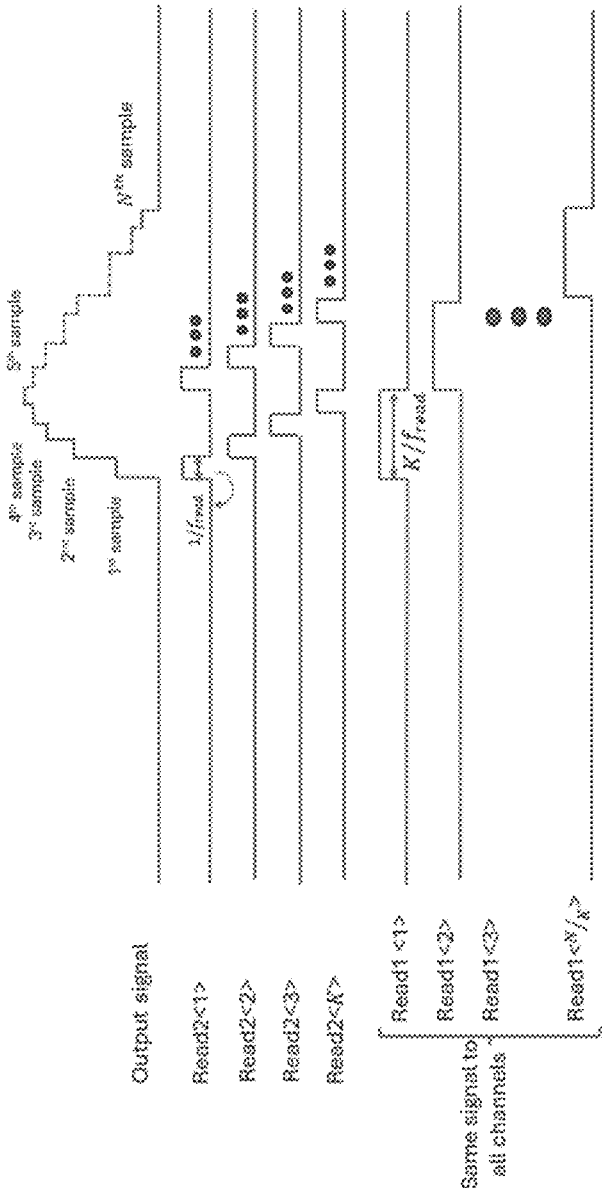
FIG. 12 illustrates an example signal timing diagram of a readout process of the multi-channel sampling system depicted in FIG. 5.

FIG. 12 illustrates an example signal timing diagram of a readout process of the multi-channel sampling system 500 depicted in FIG. 5. Even though not illustrated in FIG. 5, every sampling cell 502-1, . . . , or 502-N includes a readout switch, SW1, to read the sampled signal. Moreover, there is also an additional switch, SW2<1:K>, connected to the output of each sampling channel 560-1, . . . , or 560-K to re-arrange the samples (illustrated in FIG. 11). The one hot readout signals, Read1<1:N/K>, (as shown in FIG. 1) are identical for every sampling channel and the sampled data is read out in parallel manner. The K parallel outputs are multiplexed and re-arranged into a single output using SW2 switches SW2<1:K> and Read2<1:K> signals. Read2 signals operate at a period of 1/f$_{read}$, while Read1 signals operate at a period of K/f$_{read}$. As shown in FIG. 12, f$_{read}$<<f$_s$ such that the readout portion has relaxed bandwidth requirements.

Figure 13:
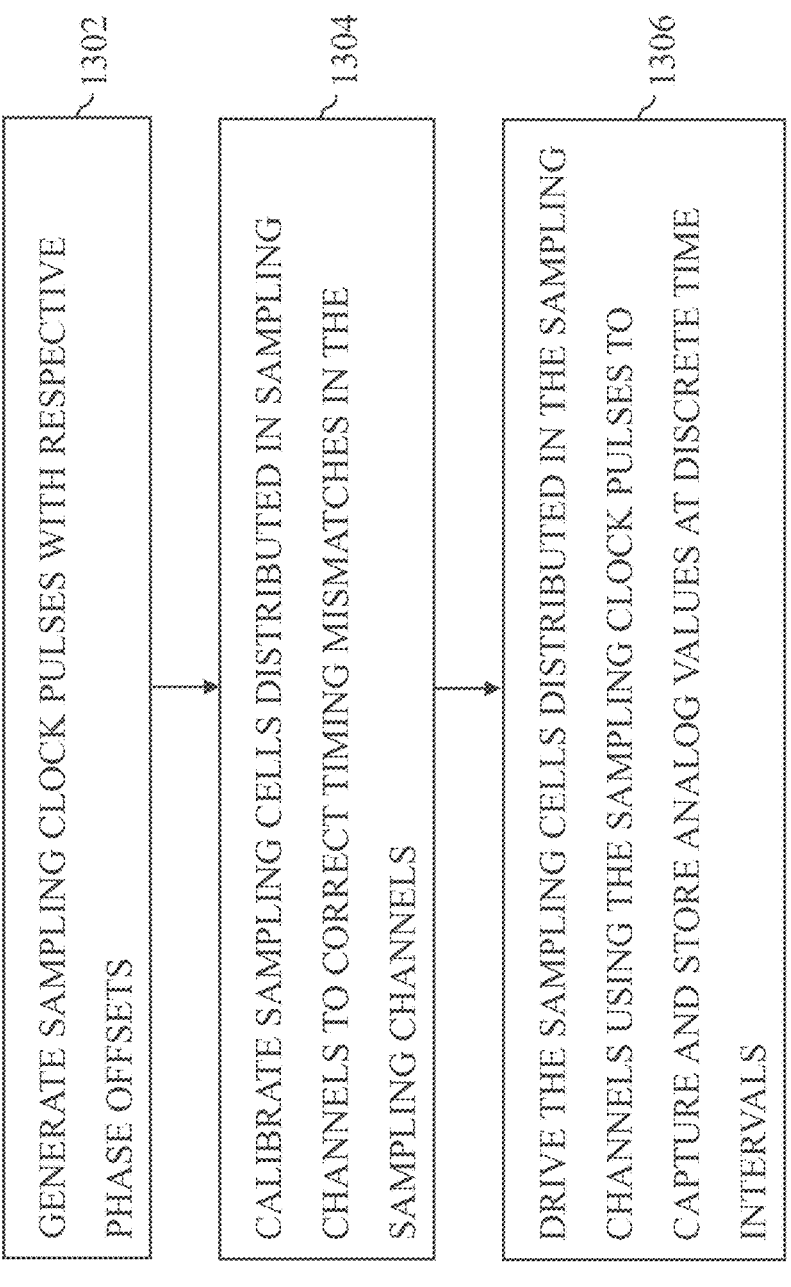
FIG. 13 is a process flow diagram of a method for sampling in accordance to an embodiment of the invention.

FIG. 13 is a process flow diagram of a method for sampling in accordance to an embodiment of the invention. According to the method, at block 1302, sampling clock pulses with respective phase offsets are generated. At block 1304, sampling cells distributed in sampling channels are calibrated to correct timing mismatches in the sampling channels. At block 1306, the sampling cells distributed in the sampling channels are driven using the sampling clock pulses to capture and store analog values at discrete time intervals. The sampling cells may be similar to, the same as, or a component of the sampling cells 102-1, . . . , 102-N depicted in FIG. 1, the sampling cells 302-1, . . . , 302-N depicted in FIG. 3, and/or the sampling cells 502-1, . . . , 502-N depicted in FIG. 5. The sampling channels may be similar to, the same as, or a component of the sampling channels 360-1, . . . , 360-K depicted in FIG. 3 and/or the sampling channels 560-1, . . . , 560-K depicted in FIG. 5.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

It should also be noted that at least some of the operations for the methods described herein may be implemented using software instructions stored on a computer useable storage medium for execution by a computer. As an example, an embodiment of a computer program product includes a computer useable storage medium to store a computer readable program.

The computer-useable or computer-readable storage medium can be an electronic, magnetic, optical, electromagnetic, infrared, or semiconductor system (or apparatus or device). Examples of non-transitory computer-useable and computer-readable storage media include a semiconductor or solid-state memory, magnetic tape, a removable computer diskette, a random-access memory (RAM), a read-only memory (ROM), a rigid magnetic disk, and an optical disk. Current examples of optical disks include a compact disk with read only memory (CD-ROM), a compact disk with read/write (CD-R/W), and a digital video disk (DVD).

Alternatively, embodiments of the invention may be implemented entirely in hardware or in an implementation containing both hardware and software elements. In embodiments which use software, the software may include but is not limited to firmware, resident software, microcode, etc.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A sampling system, the sampling system comprising:
a plurality of sampling cells; and
a plurality of calibration units connected to the sampling cells and configured to correct a plurality of timing mismatches in the sampling cells, wherein the sampling cells are distributed into a plurality of sampling channels, and wherein the sampling cells in the sampling channels are driven by a plurality of sampling clock pulses with a plurality of respective phase offsets, wherein one of the calibration units comprises:
an oscillator having a number of cycles;
a digital counter configured to capture a count value that is representative of a time duration to complete the number of cycles;
a digital integrator configured to accumulate a difference between a predetermined count value and the captured count value; and
a digital to analog converter (DAC) configured to translate an output from the digital integrator into an analog input for a plurality of delay cells in one of the sampling cells of the sampling system for correcting one of the timing mismatches in the sampling system.

2. The sampling system of claim 1, wherein the one of the calibration units further comprises a bias generator configured to generate a bias voltage based on the analog input.

3. The sampling system of claim 1, wherein the analog input comprises a current value.

4. The sampling system of claim 1, wherein the number of cycles of the oscillator is tunable in order to enhance calibration accuracy.

5. The sampling system of claim 1, wherein the oscillator is configured to revolve around in the number of cycles.

6. The sampling system of claim 1, wherein the analog input is accessible and tunable via an external terminal.

7. The sampling system of claim 1, wherein the sampling cells are evenly distributed into the sampling channels, wherein each of the sampling channels contains an identical number of sampling cells, wherein all sampling cells in each of the sampling channels are driven by a sampling clock pulse with a specific phase offset of the sampling clock pulses.

8. The sampling system of claim 1, wherein the sampling cells are configured to capture and store a plurality of analog values at a plurality of discrete time intervals, wherein each of the sampling cells is configured to operate in one of a sampling mode and a readout mode, and wherein a plurality of delay cells in all sampling cells in each of the sampling channels are configured to propagate one of the sampling clock pulses sequentially.

9. The sampling system of claim 1, wherein each of the sampling cells comprises a sampling switch, a capacitor, a buffer, a readout switch, and a delay cell, wherein the sampling switch and the capacitor are configured to capture and store analog data, wherein the readout switch and the buffer are configured to read the stored analog data.

10. The sampling system of claim 1, wherein data that is read out from the sampling channels is sequentially arranged in a digital domain.

11. The sampling system of claim 1, further comprising a clock circuit configured to generate the sampling clock pulses with the respective phase offsets, wherein the clock circuit comprises an interpolator configured to generate the respective phase offsets for the sampling clock pulses that are tunable to adjust a plurality of timing delays between the sampling channels.

12. A sampling system, the sampling system comprising:
a plurality of sampling cells; and
a plurality of calibration units connected to the sampling cells and configured to correct a plurality of timing mismatches in the sampling cells, wherein the sampling cells are distributed into a plurality of sampling channels, wherein the sampling cells in the sampling channels are driven by a plurality of sampling clock pulses with a plurality of respective phase offsets,
wherein each of the sampling cells comprises a sampling switch, a capacitor, a buffer, a readout switch, and a delay cell, wherein the sampling switch and the capacitor are configured to capture and store analog data, and wherein the readout switch and the buffer are configured to read the stored analog data.

13. The sampling system of claim 12, wherein the sampling cells are evenly distributed into the sampling channels, wherein each of the sampling channels contains an identical number of sampling cells, wherein all sampling cells in each of the sampling channels are driven by a sampling clock pulse with a specific phase offset of the sampling clock pulses.

14. The sampling system of claim 12, wherein the sampling cells are configured to capture and store a plurality of analog values at a plurality of discrete time intervals, wherein each of the sampling cells is configured to operate in one of a sampling mode and a readout mode, and wherein a plurality of delay cells in all sampling cells in each of the sampling channels are configured to propagate one of the sampling clock pulses sequentially.

15. The sampling system of claim 12, wherein data that is read out from the sampling channels is sequentially arranged in a digital domain.

16. A sampling system, the sampling system comprising:
a plurality of sampling cells; and
a plurality of calibration units connected to the sampling cells and configured to correct a plurality of timing mismatches in the sampling cells, wherein the sampling cells are distributed into a plurality of sampling channels, and wherein the sampling cells in the sampling channels are driven by a plurality of sampling clock pulses with a plurality of respective phase offsets,
wherein the sampling system further comprises a clock circuit configured to generate the sampling clock pulses with the respective phase offsets, wherein the clock circuit comprises an interpolator configured to generate the respective phase offsets for the sampling clock pulses that are tunable to adjust a plurality of timing delays between the sampling channels.

17. The sampling system of claim 16, wherein the sampling cells are evenly distributed into the sampling channels, wherein each of the sampling channels contains an identical number of sampling cells, wherein all sampling cells in each of the sampling channels are driven by a sampling clock pulse with a specific phase offset of the sampling clock pulses.

18. The sampling system of claim 16, wherein the sampling cells are configured to capture and store a plurality of analog values at a plurality of discrete time intervals.

19. The sampling system of claim 18, wherein each of the sampling cells is configured to operate in one of a sampling mode and a readout mode, and wherein a plurality of delay cells in all sampling cells in each of the sampling channels are configured to propagate one of the sampling clock pulses sequentially.

20. The sampling system of claim 16, wherein data that is read out from the sampling channels is sequentially arranged in a digital domain.

* * * * *